United States Patent

Vojak et al.

Patent Number: 5,815,054
Date of Patent: Sep. 29, 1998

[54] SURFACE MICROMACHINED ACOUSTIC WAVE PIEZOELECTRIC CRYSTAL WITH ELECTRODES ON RAISED RIDGES AND IN SPACES THEREBETWEEN

[75] Inventors: Bruce Vojak, Wheaton; Jiashi Yang, Schaumburg; Jin Huang, Hoffman Estates; John Mattson, Palatine, all of Ill.

[73] Assignee: Motorola Inc., Schaumburg, Ill.

[21] Appl. No.: 863,404

[22] Filed: May 27, 1997

[51] Int. Cl.$^6$ .............................. H03H 9/205; H03H 9/56
[52] U.S. Cl. ........................ 333/191; 310/320; 310/323; 310/366
[58] Field of Search ..................................... 333/186, 187, 333/189, 191, 192, 193–196; 310/313 R, 313 B, 313 C, 313 D, 320–323, 366, 367

[56] References Cited

FOREIGN PATENT DOCUMENTS

| 4-138707 A | 5/1992 | Japan | 310/313 R |
| 2 106 346 | 4/1983 | United Kingdom | 310/313 R |

OTHER PUBLICATIONS

M.J. Brady et al.; "Generation of High–Frequency Acoustic Surface Waves on Piezoelectric Wafers"; *IBM Technical Disclosure Bulletin*, vol. 15, No. 10, Mar. 1973, pp. 3273–3274.

"Design and Test of 3 Ghz, Fundamental Mode Surface Transverse Wave Resonators on Quartz," IEEE Transactions on Ultrasonics, Ferroelectrics, and Frequency Control, vol. 44, No. 2, Mar. 1997, pp. 399–405. Bigler.

"Wideband Bragg Cell Efficiency Enhancement Techniques," Proceedings of SPIE–The International Society for Optical Engineering, Optical Technology for Microwave Applications II; vol. 544, Apr. 9–10, 1985, pp. 72–79. Yao.

*Primary Examiner*—Robert Pascal
*Assistant Examiner*—Barbara Summons
*Attorney, Agent, or Firm*—Brian M. Mancini; Gary J. Cunningham

[57] ABSTRACT

A high frequency acoustic wave piezoelectric device (10) having parallel etched channels cut into a surface of a piezoelectric substrate so as to form micromachined ridges (20). Top electrodes (30) are located on tops (26) of the ridges (20) and bottom electrodes (32) are located on bottoms of the channels in spacings (22) between ridges (20). The top and bottom electrodes (30, 32) are offset from each other and substantially non-opposing. The electrodes (30, 32) generate a sufficient vertical electrical field (38) when driven to cause the ridges (20) to resonate. A height (28) of the ridges (20) define the operating frequency. The ridges (20) can be made small enough to produce frequencies well over 100 MHz in a fundamental bulk acoustic wave mode.

8 Claims, 2 Drawing Sheets

SURFACE MICROMACHINED ACOUSTIC WAVE PIEZOELECTRIC CRYSTAL WITH ELECTRODES ON RAISED RIDGES AND IN SPACES THEREBETWEEN

FIELD OF THE INVENTION

The present invention relates generally to piezoelectric devices and, in particular, to bulk and surface acoustic wave piezoelectric resonators.

BACKGROUND OF THE INVENTION

Piezoelectric devices are known to include various types of crystal resonators and crystal filters. These piezoelectric devices are commonly found in electronic communication devices, such as cellular phones, pagers, two-way radios and wireless data devices. As spectrum allocations are being filled and available lower frequency bands become more crowded, the need has arisen for communication devices to operate at higher radio frequencies (RF). Similarly, the crystal resonators and filters utilized in these devices will need to operate at higher intermediate frequencies (IF).

The IF frequencies presently being used in two-way radios, cellular phones and pagers range from between 10.7 to 120 Megahertz (MHz) (17.9, 45, 73.35, 109.65 and 114 MHz being some of the more common IF frequencies). Typically, bulk acoustic wave (BAW) crystal devices are used for these IF applications. Bulk acoustic wave crystals can operate in a fundamental frequency mode or higher overtone frequency modes (i.e., 3rd overtone, 5th overtone, etc.). Low cost fundamental mode quartz devices have been successfully implemented up to about 50 MHz. Above this frequency the cost of fundamental mode devices increases greatly. Therefore, overtone modes are typically utilized.

The overtone mode of operation for an IF crystal has a number of drawbacks. Operating a crystal in an overtone mode raises the operating impedance. Also, filters being designed for overtone operation normally require inductors at their terminating ports which is undesirable from a viewpoint of radio cost and extraneous signal susceptibility. Also, an overtone mode requires a much higher matching termination impedance than its fundamental mode counterpart which is undesirable from a radio sensitivity viewpoint. In addition, the achievable bandwidth for an overtone mode crystal filter is much narrower than is possible for a fundamental mode crystal filter. Many customer requirements for wide bandwidth filters can not be met by overtone mode bulk acoustic wave crystals.

The conventional method for increasing the fundamental mode frequency of a bulk acoustic wave crystal is the removal of quartz material from the surface of the crystal blank by mechanical lapping. However, the mechanical lapping process has practical limitations because the quartz blanks become very thin at high frequencies. This extremely narrow profile of the crystal blank causes material handling problems and breakage which results in degraded yields and increased costs.

To get around and improve upon this limitation, a technology known today as the "inverted mesa" crystal blank technology has been used in quartz technology. In this method, a mechanically lapped blank is provided, and the perimeter of the inverted mesa blank is left at a given thickness for improved handling and processing while a center of the crystal blank is raised in frequency by removal of quartz material in the middle of the crystal blank. The structure formed resembles an inverted mesa. Inverted mesa processes are low capacity techniques which tend to progressively degrade surface quality during processing.

Although the concept of the inverted mesa fulfills the need for a high frequency crystal blank, the practical implementation with today's known techniques have several serious drawbacks. The cost of equipment for mass producing large quantities of inverted mesa blanks is expensive. The time it takes to remove a given amount of material at the center of the blank is slow and therefore expensive. Typically, the surfaces of the thinned quartz at the mesa have unacceptable flatness and parallelism and additional defects which degrade performance. In addition, it is necessary to use a premium grade of quartz material which is usually swept quartz. Because of these limitations in producing bulk acoustic wave inverted mesa crystals, these devices have not found wide acceptance in the industry.

Piezoelectric devices are also used at RF frequencies and are presently being used in two-way radios and cellular phones ranging in frequency from 800 MHz to 1.5 GHz. Typically, surface acoustic wave (SAW) technology has been used to produce these very high frequency devices. However, these devices suffer from poorer temperature performance than BAW devices. In addition, the size of SAW devices is inversely proportional to frequency, i.e., lower frequencies demand larger devices.

There is a need for an acoustic wave device that allows operation at fundamental and overtone frequencies in excess of 100 MHz. Also, there is a need for an acoustic wave device that is low cost, high yield, is robust under processing and is readily manufacturable without custom equipment.

DETAILED DESCRIPTION OF THE PREFERRED EMBODIMENT

The present invention provides a high frequency acoustic wave piezoelectric resonator having etched channels cut into a surface of a piezoelectric substrate so as to form micromachined ridges. The ridges are caused to vibrate by applying an AC electric field to top and bottom electrodes disposed on the ridges and in the channels, respectively. When the electrodes are electrically energized a substantially vertical electric field is generated within each ridge between the top and bottom electrodes that is substantially perpendicular to an upper surface of the substrate and causes a piezoelectric strain which generates an acoustic wave directed vertically into the substrate. It is also possible in the present invention to generate surface acoustic waves. The ridges are cantilevered out from the surface of the substrate with the vertical height of the ridges substantially defining the vibrating frequency of the ridges. The ridges are readily manufactured by low-cost, high-yield photolithographic and etching techniques using commonly available equipment. The ridges can be made small enough to produce frequencies well over 100 MHz.

Figure 1:
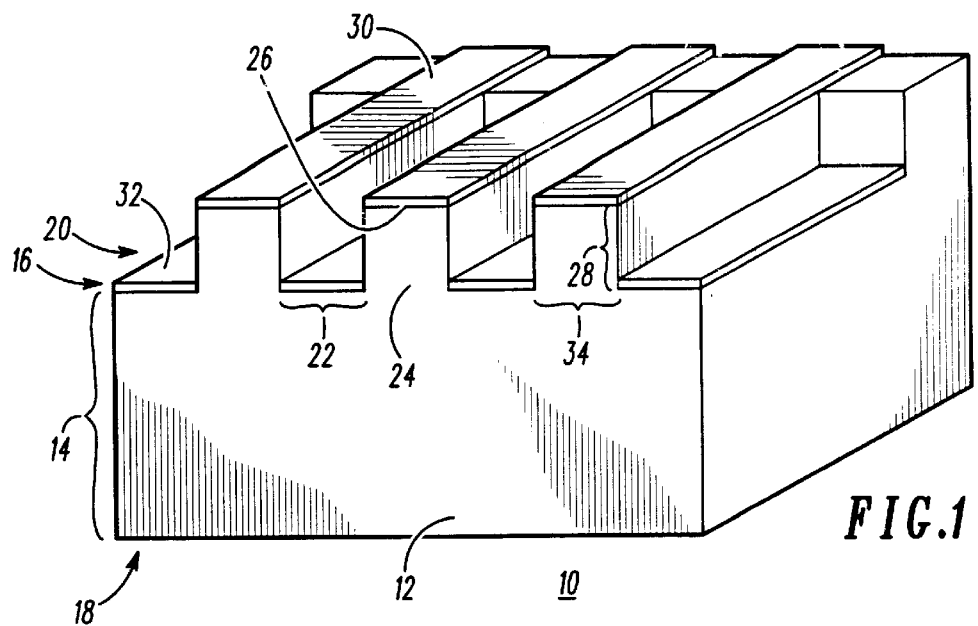
FIG. 1 shows a simplified perspective view of a cross section of a micromachined piezoelectric resonator, in accordance with the present invention.

FIG. 1 shows a simplified perspective cross-sectional view of an acoustic wave piezoelectric resonator 10, in accordance with the present invention. A piezoelectric substrate 12 is provided which has a predetermined thickness 14 defined by an upper surface 16 and a lower surface 18. A plurality of raised ridges 20 are integral with, and extend upwardly from, the upper surface 16 of the piezoelectric substrate 12. A spacing 22 is located between the raised ridges 20. The raised ridges 20 have a base 24 at the upper surface 16 of the substrate and a top 26 defining a height 28. The height 28 of the ridges 20 substantially defines an operating frequency of the resonator 10. The ridges also have a width 34, as shown. Each ridge 20 has a corresponding top electrode 30 disposed on the top 26 of the ridge 20. Each spacing 22 has a corresponding bottom electrode 32 disposed thereon. In this configuration, the top electrodes 30 and bottom electrodes 32 are substantially non-opposing.

It should be recognized that the height of the ridges is one of the critical design parameters of the present invention, although the width and spacing do have an impact on frequency, also. As the frequency of the device is substantially driven by the height of the ridges, the area or length of the substrate is immaterial in defining device frequency. In contrast, surface acoustic wave (SAW) devices disadvantageously are required to have larger sized substrates for lower frequencies. Therefore, the present invention provides a substrate size advantage over SAW devices where the height of the raised ridges is greater than the ridge width or spacing between the ridges.

In the present invention, it is not necessary that the ridges be of a uniform dimension with squared edges. The ridges may have different shapes such as rounded, angular, or irregular. Nor is it necessary that the ridges be parallel to each other, have the same width, or have equal spacings therebetween. In addition, it is not necessary that the ridges have the exact same height, as will be discussed below.

However, in a preferred embodiment, it is desired that the height and width of the ridges be substantially the same and of uniform shape such that a similar operating frequency is maintained within each ridge. Also, it is preferred that the raised ridges are substantially parallel to each other and the spacing between the raised ridges is substantially periodic. This advantageously provides for ease of manufacture and reduction of possible spurious operating frequency modes.

The use of a squared-edge shape factor for the ridges, as represented in FIG. 1, reduces spurious modes and provides a natural mask for metal deposition of the top and bottom electrodes. When plated from above, the top and bottom electrodes can be deposited at the same time. In some cases, it was found that the squared-edge shape can allow some metal deposition on the sides of the ridges shorting the top and bottom electrodes together. This problem is solved by using aluminum plating in a preferred embodiment. Any aluminum deposited on the side of a ridge is of such a thin layer that natural exposure to oxygen in the air causes the aluminum to quickly oxidize to form a non-shorting insulator. Alternatively, the aluminum can be exposed to an enriched oxidizing environment, such as an oxygen plasma, to more quickly open any electrical shorts on the side of the ridges. A slightly dovetailed shape factor would provide better masking for depositing of the electrodes, but this is harder to reproducibly manufacture and is not necessary as explained above.

Figure 2:
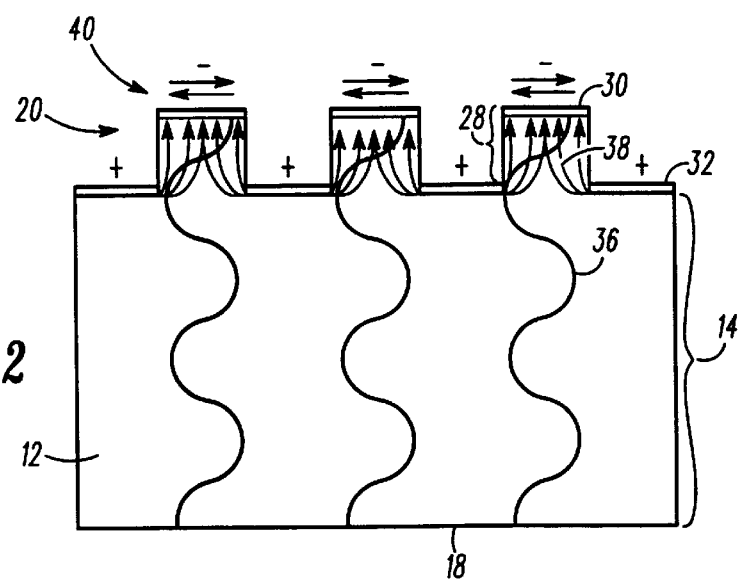
FIG. 2 shows a cross-sectional view of an in-phase configuration of the piezoelectric resonator, in accordance with the present invention.

FIG. 2 shows a cross sectional view of a first embodiment of the present invention. In this embodiment, the top electrodes 30 are commonly electrically connected together and the bottom electrodes 32 are commonly electrically connected together. When a bias (+ and −) is applied between the top and bottom electrodes 30, 32 a substantially vertical electric field 38 is set up substantially within the ridge 20 between the electrodes 30, 32 even though the electrodes 30, 32 are substantially nonopposing. As is known in the art, an electric field will be concentrated in areas of higher dielectric constant. Piezoelectric materials, such as quartz, lithium niobate, lithium tantalate, PZT, and the like have higher dielectric constants than air or vacuum. Therefore, the vertical electric field 38 will appear primarily within the ridge 20 under the top electrodes 30, even though the bottom electrode 32 is substantially non-opposing from the top electrode 30.

The vertical electric field 38 imparts an piezoelectric strain 40 in the ridge 20. For example, in a quartz piezoelectric substrate of an AT-cut angle, the piezoelectric strain developed is substantially of a thickness-shear mode. Although, other strains can exist with different substrate orientations. The present invention will work for various substrate materials, angles, and electromechanical modes such as, but not limited to, thickness-shear, extensional, thickness-twist, flexural, and others. Moreover, many different types of piezoelectric materials and angle cuts are known in the art that can provide proper excitation to drive the ridges of the present invention. These include, but are not limited to, AT-cut quartz, BT-cut quartz, ST-cut quartz, X-cut 163° lithium niobate, lithium tantalate, and properly poled PZT.

It should be recognized that other known or newly derived cuts may be more optimum, particularly for temperature performance. For any of these selected materials, when the electrodes 30, 32 are piezoelectrically driven by an AC signal, the raised ridges 20 are driven in a substantially in-phase vibration mode (i.e., all the ridges move in unison), as shown in FIG. 2. The vibration of each ridges 20 drives a vertical bulk acoustic wave 36 into the substrate, unlike the single surface lateral wave produced in prior art SAW devices which is shared among all the electrodes. FIG. 2 shows each ridge 20 vibrating at about ½ wavelength, defined by the height 28 of each ridge 20, although this is not a requirement. The ridge 20 generates a bulk wave 36 in the substrate 12 of many wavelengths depending on the thickness 14 of the substrate 12. The present invention can be driven in a fundamental mode as well as even and odd overtone modes (i.e., 2nd, 3rd, 4th, 5th, etc.).

It should be recognized that, due to the cantilevered ridge configuration, the driven piezoelectric mode may couple to a flexural mode. For example, driving the ridges with a thickness-shear mode parallel to the width direction of the ridges (as shown in FIG. 2) will naturally couple to a flexural mode. The shape factor of the ridges can be modified to either support such a hybrid mode or to attempt to cancel either of the modes. In addition, the orientation of the substrate can be rotated at any angle about a normal to the upper surface so as to drive a thickness-shear mode parallel to the width direction of the ridges, perpendicular to the width direction of the ridges, or at any angle therebetween.

The vertical bulk acoustic waves 36 in this embodiment are in-phase and set up a standing wave with the lower surface 18 boundary of the substrate 12. The present invention operates with any substrate thickness 14. However, because of possible reflections, it is preferred that the thickness 14 of the substrate 12 be approximately an integral multiple of the ridge height 28 in order to support these bulk acoustic waves 36. It should be recognized that where it is desired to mount the substrate 12 on its lower surface 18 in a package, the bulk waves 36 will be damped, correspondingly lowering the Q of the ridge vibrations.

In practice, it is difficult to precisely control the thickness of the substrate, particularly when devices are being manufactured in a large wafer array process. Therefore, multiple harmonic modes will appear due to bulk wave resonances of the substrate.

Figure 3:
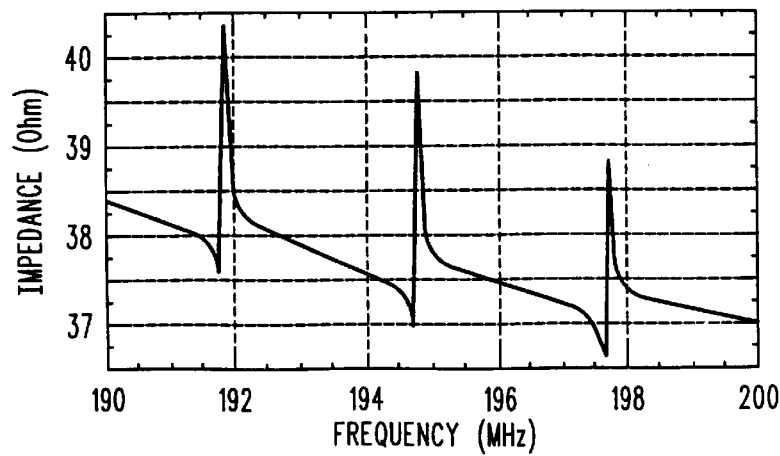
FIG. 3 shows a graphic representation of a frequency response of resonator constructed as shown in FIG. 2, in accordance with the present invention.

FIG. 3 shows a graph of impedance versus frequency response of a device of the first embodiment. The device was manufactured on a readily available ST-cut quartz wafer having a thickness of about 20 mils (0.5 mm), a ridge height of about 3 microns, a ridge width of about 3 microns, and a spacing of about 5 microns. As can be seen, multiple frequency modes are present occurring at approximate 3 MHz intervals. The modes extended from about 150 MHz to about 300 MHz centered at about 195 MHz. The use of this device in a radio communication device may cause frequency hopping unless appropriate filtering is provided.

Figure 4:
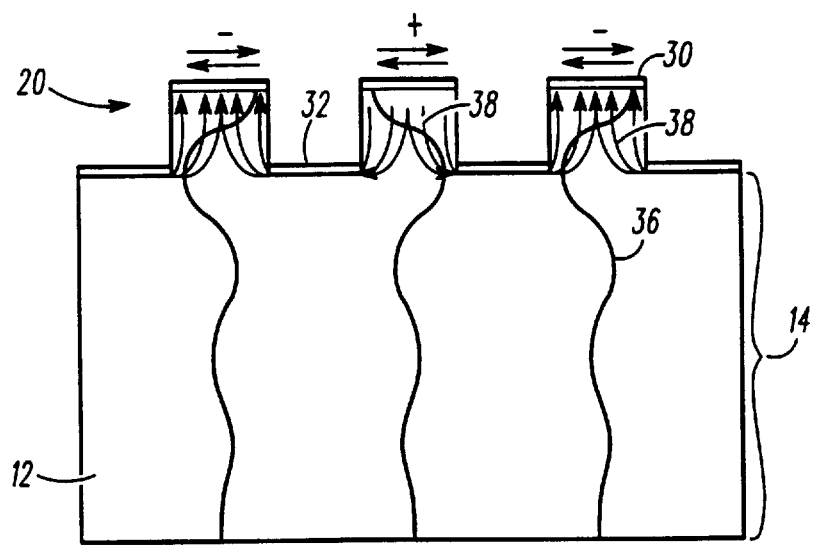
FIG. 4 shows a cross-sectional view of an anti-phase configuration of the piezoelectric resonator, in accordance with the present invention.

FIG. 4 shows a preferred embodiment of the present invention where the vertical bulk acoustic waves 36 generated by each ridge 20 is substantially canceled within the body of the substrate. The waves 36 decay as a function of depth into the substrate and are also dependent on the spacing between ridges. By canceling the waves 36 within the body of the substrate 12, energy is maintained in the ridges, and no energy is lost in the substrate 12 to lower the Q of the ridge vibrations. The device of FIG. 4 has the same configuration as the device of FIG. 2 except for having the electrodes biased in a different manner, and the description of FIG. 2 is hereby incorporated by reference.

In the preferred embodiment, the top electrodes 30 are alternately connected to a first and a second bias connection (+ and −). The first and second connections are biased such that a small electric field (not shown) extends directly between the top electrodes. However, the electric field 38 primarily extends vertically within each ridges 20 under the top electrodes 30 due to the higher dielectric constant of the piezoelectric substrate over air or vacuum.

In this embodiment, it is not necessary to have any bottom electrodes 32. However, the use of bottom electrodes beneficially concentrates the electric field 38 within the ridges 20. The bottom electrodes 32 can be left floating or can be connected to ground. This preferred embodiment advantageously allows great latitude in the use and electrical connection to the bottom electrodes 32. This makes manufacturing much easier.

It should be recognized that the electric field strength of the preferred embodiment is half that of the first embodiment. In addition, the shorter the spacing is between ridges, the higher the coupling and input capacitance between top electrodes. However, the preferred embodiment provides a much cleaner frequency response than the first embodiment. This is the result of the raised ridges vibrating in a substantially anti-phase mode (i.e., the ridges vibrate about 180° out-of-phase with their neighboring ridges) when the first and second connections are driven by an AC signal.

The height of each ridge substantially defines an operating frequency. However, it is also possible in the present invention to generate acoustic waves having a frequency dependent on the height, width, and spacings of the ridges. In the preferred embodiment, each ridge 20 will generate a vertical bulk acoustic wave 36 into the body of the substrate 12. The bulk acoustic wave 36 from each ridge is out-of-phase from its neighbors thereby canceling within the substrate 12. In this case, substantially all of the acoustic energy remains balanced in or near the ridges 20 as a localized resonance, and very little energy is lost in the body of the substrate 12. This prevents bulk wave reflections off of the lower surface of the substrate and therefore provides a single resonant mode. Moreover, this embodiment benefits from not being sensitive to the thickness 14 of the substrate 12 or the mounting since the nature of the ridge vibrations cancels bulk waves 36 within the substrate 12 such that substantially no energy appears at the lower surface.

Figure 5:
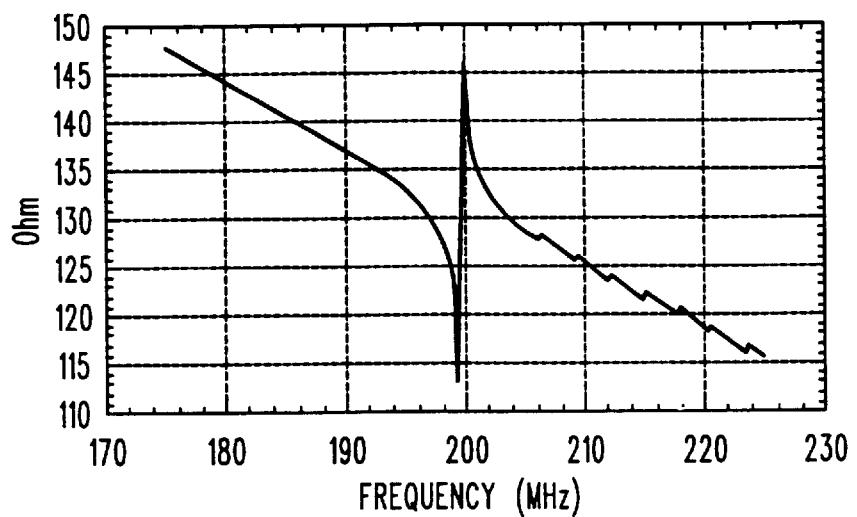
FIG. 5 shows a graphic representation of a frequency response of resonator constructed as shown in FIG. 4, in accordance with the present invention.

FIG. 5 shows a graph of impedance versus frequency response of a device of the preferred embodiment of FIG. 4. This device was manufactured on an ST-cut quartz wafer due to its immediate availability. However, it should be recognized that other wafer cuts and orientations, such as AT-cut quartz or Y-cut lithium niobate for example, will be preferred for optimal temperature performance and/or coupling. For this embodiment, the wafer used had a thickness of about 20 mils (0.5 mm), a ridge height of about 3 microns, a ridge width of about 3 microns, and a spacing of about 6 microns. As can be seen, a single frequency mode is present occurring at about 199 MHz which is an improvement over the multiple frequencies present in the frequency response of the first embodiment of FIG. 3.

The devices described above can provide hundreds of individual ridge resonators, any of which can be coupled in series or shunt (parallel) connections. A number of advanced devices can be thus realized. Firstly, individual resonators can be designed with a different width or shape factor to modestly adjust the frequency of that resonator, or may be individually tuned used known techniques such as laser ablation or plating. Advantageously, a grouping of these resonators can be connected in a ladder network to provide a specific filtering function using known design techniques. Alternatively, the frequencies of the resonators could be designed to cover a range of desirable frequencies. These resonators could be connected in parallel to provide a filter of that desired frequency range. It is envisioned that a very wide frequency range could be obtained in this manner. Correspondingly, a substrate of a piezoelectric ceramic such as PZT could be provided with poling along a width direction, and the top and bottom electrodes could be used to provide poling in the ridges that is orthogonal to the poling of the substrate. In this configuration, the substrate could be driven in a width-extensional mode and the ridges in a length-extensional mode (i.e., miniature Rosen transformers). The transformers could then be connected in series or parallel configurations to provide any of a wide range of transformer ratios.

In addition, the present invention could be used in a simple resonator embodiment in a sensitive sensor application. Further, resonators and filters of greatly different frequencies could be manufactured monolithically so as to produce one or more RF, IF and local oscillator functions for radios. Compared to conventional bulk acoustic resonators, the present invention allows the manufacturing of several resonators and/or filters with differing frequencies in one small, monolithic crystal substrate. Advantageously, any of the above embodiments can be obtained with no change in processing other than a simple mask change and subsequent wire bonding connections as needed. Also, the present invention allows substantially simultaneous production of an array of high frequency bulk acoustic wave piezoelectric devices, which is advantageous in terms of mass production.

In one embodiment of the present invention a radio communication device is provided having at least one of a transmitter and a receiver and having an oscillator which contains a piezoelectric resonator, in accordance with the present invention. In particular, the radio communication device comprises a receiver which operates under the control of a microcontroller. The communication device includes an IF oscillator coupled to the receiver. The IF oscillator incorporates an acoustic wave piezoelectric resonator utilizing the principles of the present invention.

A method of making a high frequency acoustic wave piezoelectric resonator will now be discussed. Generally, a first major step of the high frequency bulk acoustic wave piezoelectric crystal manufacturing process begins by providing a polished piezoelectric substrate. A second step includes depositing a metal layer and a photoresist layer. A third step includes exposing the photoresist layer through a predetermined pattern and developing the photoresist layer. A fourth step includes etching the metal layer to form a metal mask and removing the photoresist. A fifth step includes etching the piezoelectric material between the metal mask down to a predetermined distance to make etched spacings in the substrate and leaving micromachined ridges. Preferably, this step is performed using reactive ion etching so as to provide a squared shape factor for the ridges. A sixth step includes making electrical connections to the device.

Preferably, additional process steps are added. A seventh step includes stripping the metal mask. An eighth step includes selectively depositing aluminum to form the top and bottom electrodes at the same time and to make electrical connections to the device. A ninth step includes exposing the aluminum to an oxidizing environment to electrically open any shorts down the sides of the ridges. More preferably, a packaging step is included where the device is hermetically packaged with the ridges sealed in a vacuum.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. An acoustic wave piezoelectric device, comprising:
   a piezoelectric substrate having a thickness defined by an upper and a lower surface;
   a plurality of raised ridges integral with the upper surface of the piezoelectric substrate and having a spacing therebetween, the raised ridges having a base at the upper surface of the substrate and a top defining a height of the ridges;
   a plurality of top electrodes disposed on corresponding tops of the raised ridges; and
   a plurality of bottom electrodes disposed on the upper surface of the piezoelectric substrate within the spacing between the raised ridges, the top and bottom electrodes being substantially non-opposing,
   the top electrodes are alternately connected to a first and a second connection wherein, when the first and second connections are driven by an AC signal, the raised ridges vibrate in a substantially anti-phase mode generating acoustic waves which are directed vertically into the piezoelectric substrate and are substantially canceled within a body of the substrate.

2. The piezoelectric device of claim 1, wherein the raised ridges are substantially parallel to each other and the spacing between the raised ridges is substantially periodic.

3. The piezoelectric device of claim 1, wherein, when the electrodes are electrically energized, a substantially vertical electric field is generated between the top and bottom electrodes that is substantially perpendicular to the upper surface of the substrate and causes a piezoelectric strain which generates the acoustic wave.

4. The piezoelectric device of claim 1, wherein the bottom electrodes are electrically connected in a configuration selected from the group consisting of floating and commonly coupled to ground.

5. The piezoelectric device of claim 1, wherein the piezoelectric substrate is comprised of quartz and the raised ridges are driven in a substantially thickness-shear mode coupled to a flexure mode when driven by an AC signal.

6. An acoustic wave piezoelectric resonator, comprising:
   a piezoelectric substrate having a thickness defined by an upper and a lower surface;
   a plurality of substantially parallel raised ridges integral with the upper surface of the piezoelectric substrate and having a periodic spacing therebetween, the raised ridges having a base at the upper surface of the substrate and a top defining a height of the ridges, the height substantially defining an operating frequency of the device;
   a plurality of top electrodes disposed on corresponding tops of the raised ridges; and
   a plurality of bottom electrodes disposed on the upper surface of the piezoelectric substrate within the spacing between the raised ridges, the top and bottom electrodes being substantially non-opposing,
   the top electrodes are alternately connected to a first and a second connection wherein, when the first and second connections are driven by an AC signal, the raised ridges vibrate in a substantially anti-phase mode generating acoustic waves which are directed vertically into the piezoelectric substrate and are substantially canceled within a body of the substrate.

7. The piezoelectric resonator of claim 6, wherein, when the electrodes are electrically energized, a substantially vertical electric field is generated between the top and bottom electrodes that is substantially perpendicular to the upper surface of the substrate and causes a piezoelectric strain which generates the acoustic wave.

8. The piezoelectric resonator of claim 6, wherein the piezoelectric substrate is comprised of quartz and the raised ridges driven in a substantially thickness-shear mode coupled to a flexure mode when driven by an AC signal.

* * * * *